(12) United States Patent
Lee

(10) Patent No.: US 6,228,763 B1
(45) Date of Patent: May 8, 2001

(54) METHOD OF FABRICATING METAL INTERCONNECT HAVING INNER AIR SPACER

(75) Inventor: Robin Lee, Hsinchu Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/515,016

(22) Filed: Feb. 29, 2000

(30) Foreign Application Priority Data

Feb. 17, 2000 (TW) .............................. 089102690

(51) Int. Cl.$^7$ .............................. H01L 21/4763
(52) U.S. Cl. .............. 438/639; 438/619; 438/421; 438/303; 438/595
(58) Field of Search ..................... 438/639, 619, 438/421–422, 303, 595

(56) References Cited

U.S. PATENT DOCUMENTS

| | | | |
|---|---|---|---|
| 5,736,446 | * | 4/1998 | Wu ........................................ 438/305 |
| 5,869,375 | * | 2/1999 | Wu ........................................ 438/291 |
| 5,915,182 | * | 6/1999 | Wu ........................................ 438/299 |
| 5,923,980 | * | 7/1999 | Gardner et al. ....................... 438/270 |
| 5,972,763 | * | 10/1999 | Chou et al. ........................... 438/305 |
| 6,001,695 | * | 12/1999 | Wu ........................................ 438/289 |
| 6,015,746 | * | 1/2000 | Yeh et al. ............................. 438/421 |
| 6,064,107 | * | 5/2000 | Yeh et al. ............................. 257/522 |
| 6,093,612 | * | 7/2000 | Suh ...................................... 438/301 |
| 6,104,077 | * | 8/2000 | Gardner et al. ....................... 257/522 |
| 6,124,177 | * | 9/2000 | Lin et al. .............................. 438/305 |

* cited by examiner

Primary Examiner—Tuan H. Nguyen
Assistant Examiner—Thanh Nguyen
(74) Attorney, Agent, or Firm—Jiawei Huang; J.C. Patents

(57) ABSTRACT

A fabrication method for a metal interconnect having an inner air spacer, applicable to multilevel interconnects technologies, is disclosed. The inner air spacer is formed adjacent to a metal layer to provide a lower dielectric constant in a metal interconnect structure. The inner air spacer is formed by initially forming a dielectric spacer on a sidewall of a second dielectric layer, which sidewall defines a trench opening. The trench opening is then filled with the metal layer. The dielectric spacer is removed to form an air gap between the metal layer and the second dielectric layer. The air gap is sealed off with a portion of a third dielectric layer to form the inner air spacer adjacent to a sidewall of the metal layer.

24 Claims, 3 Drawing Sheets and constitute a part of this specification. The drawings illustrate embodiments of the invention and, together with the description, serve to explain the principles of the invention.

METHOD OF FABRICATING METAL INTERCONNECT HAVING INNER AIR SPACER

CROSS-REFERENCE TO RELATED APPLICATION

This application claims the priority benefit of Taiwan application serial no. 89102690, filed Feb. 17, 2000.

BACKGROUND OF THE INVENTION

1. Field of Invention

The present invention relates to a method of fabricating a semiconductor device. More particularly, the present invention relates to a fabrication method for a metal interconnect having an inner air spacer, applicable to multilevel interconnect technologies.

2. Description of Related Art

In order to build an integrated circuit, it is necessary to fabricate many active devices on a single substrate. Initially, each of the devices must be electrically isolated from the others, and specific devices must subsequently be interconnected in fabrication sequence so as to implement the desired circuit function, such as processing data in a microprocessor.

The data processing capability of the microprocessor has been extended to respond to more powerful and sophisticated program software, while such extension inevitably requires an increase in the operation speed of a metal oxide semiconductor (MOS) device. The operation speed of the MOS device is increased by creating an environment having a low dielectric constant between adjacent metal lines in a multilevel interconnect structure, while such environment is essential for reducing a cross-talk error and a capacitance between the metal lines. Since air was known to have a very low dielectric constant (about 1), an optimal dielectric constant for reduction of cross-talk and adverse capacitive coupling in polysilicon and metal interconnect, an air gap structure formed between the metal lines has been adopted in most interconnect process. As a result, the circuit speed is improved and logical cross-talk errors are avoided. FIGS. 1A and 1B are schematic diagrams illustrating a conventional method of fabricating the air gap structure.

Referring to FIG. 1A, a dielectric layer 100 is provided above a device layer (not shown), wherein the dielectric layer 100 has metal plugs 102 formed therein. Metal lines 104 are formed on the dielectric layer 100 to cover the metal plugs 102. As a result, the metal lines 104 are not in direct contact with the metal layer (not shown) below the dielectric layer 100, except through the metal plugs 102 in order to prevent an electrical short.

Referring to FIG. 1B, an inter-metal dielectric (IMD) layer 106 is formed to cover the metal lines 104 and the dielectric layer 100 by a method, such as plasma enhanced chemical vapor deposition (PECVD). The IMD layer is usually made of material, such as silicon dioxide, due to its low dielectric constant (about 3.9). According to the method taught by such prior art, one skilled in the art would expect to form a void or air gap 108 between two adjacent metal lines 104, as shown in FIG. 1B. However, the air gap 108 formed as such, does not effectively reduce the dielectric constant between the metal lines 104. Moreover, the air gap 108 can only be formed between metal lines 104 that are in a denser distribution. Therefore, other materials, such as hydrogen silsesquioxane (HSQ) which provides a lower dielectric constant (about 2.9–3.0) and offers a better topographical planarity is needed to reduce the dielectric constant between the metal lines.

However, when HSQ is applied to interconnect technology, particularly for gap filling, it was found that its dielectric constant became undesirably high as a result of subsequent processing. For example, after the deposition of the silicon oxide layer by PECVD, the dielectric constant of the deposited HSQ layer undesirably increased from about 2.9 to about 3.6. This rise in dielectric constant is believed to be a result of the oxidation of the top surface of the HSQ due to exposure to an oxygen-containing ambient at an elevated temperature. The undesirable increase in the dielectric constant of the HSQ layer adversely impacts the intra-metal capacitance and, therefore circuit speed.

SUMMARY OF THE INVENTION

The invention provides a metal interconnect structure having an inner air spacer between metal interconnects, applicable to multilevel interconnect technologies, and a fabrication method thereof.

As embodied and broadly described herein, the invention provides an inner air spacers, which is formed adjacent to sidewall of a metal layer in a dual damascene structure. The inner air spacer is formed as an air recess adjacent to the metal layer and are delineated by a metal layer, a second dielectric layer, and a third dielectric layer on the first dielectric layer.

According to one aspect of the present invention, a fabrication method for a metal interconnect structure having an inner air spacer between metal interconnects is provided. A first dielectric layer is formed on a MOS device layer, followed by forming an anti-reflection coating (ARC) layer on the first dielectric layer. The first dielectric layer and the ARC layer are patterned to form a contact opening, which contact opening is filled with a metal plug. A second dielectric layer is formed on the metal plug and the ARC layer. The second dielectric layer is then patterned to form a trench opening before forming dielectric spacers on sidewalls of the trench opening. A metal layer is formed to fill the trench opening, and the metal layer outside the trench opening is removed by chemical mechanical polishing (CMP). The second dielectric layer and the dielectric spacer are removed to expose the metal layer with curve-in edges before forming a third dielectric layer on the metal layer. As a result, the inner air spacers are formed as voids between the curve-in edges of the metal layer and the third dielectric layer.

Since the inner air spacer is formed closely adjacent to the metal layer, the dielectric constant between the metal interconnects is significantly reduced. The inner air spacer formed as above is also compatible with other dielectric materials to achieve the objective of reducing the dielectric constant. Furthermore, the inner air spacers can be formed on the sidewalls of the metal layers that are located wider apart. Thus, this ensures a uniform reduction of the dielectric constant between the metal interconnects and improves the circuit speed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Description of the present invention is made in two embodiments showing different modes of fabricating a metal interconnect structure having inner air spacers. FIG. 2A through 2D, are schematic, cross-sectional diagrams illustrating a method of fabricating a metal interconnect structure having an inner air spacer according to the first embodiment of this invention. Moreover, FIGS. 3A through 3D are schematic, cross-sectional diagrams illustrating a method of fabricating a metal interconnect structure having an inner air spacer according to the second embodiment of this invention.

First Embodiment

Figure 1A:
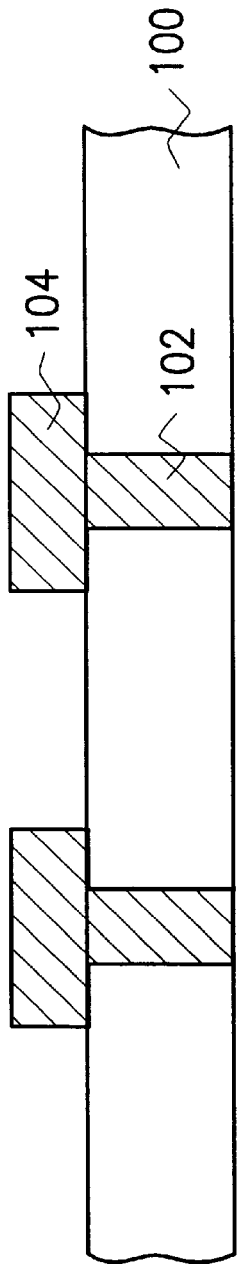
FIGS. 1A and 1B are schematic, cross-sectional diagrams illustrating a conventional method of fabricating a metal interconnect having an air gap structure.
Figure 1B:
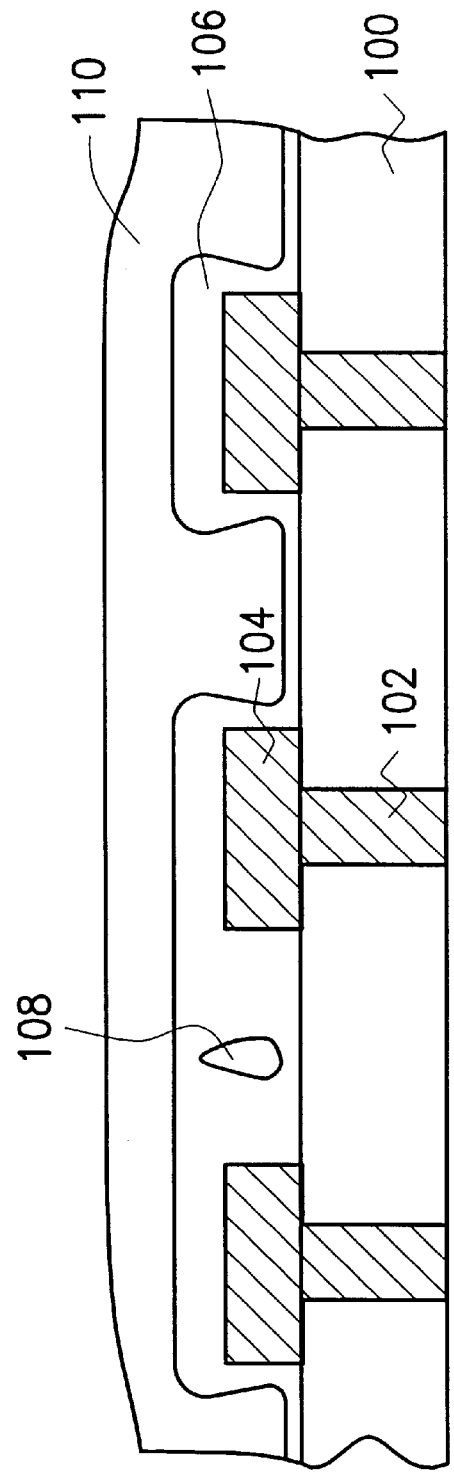
Figure 2A:
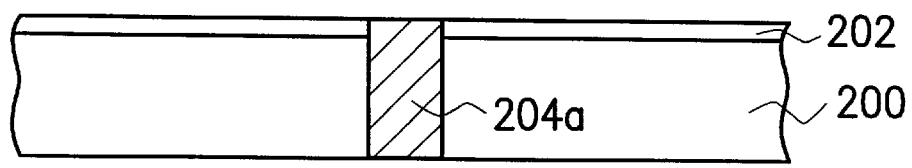
FIGS. 2A through 2D are schematic, cross-sectional diagrams illustrating a method of fabricating a metal interconnect having an inner air spacer according to the first embodiment of this invention.

Referring to FIG. 2A, a first dielectric layer 200 is formed on a MOS device layer (not shown). An anti-reflection coating (ARC) layer 202 is then formed on the first dielectric layer 200. The first dielectric layer 200 is made of material, such as silicon dioxide, while the ARC layer 202 may be made of any anti-reflective materials, but is preferably made of silicon oxy-nitride. The ARC layer 202 in this case prevents etching damage done to the first dielectric layer 200 and improves the photolithographic ability in a photolithographic process. The ARC layer 202 and the first dielectric layer 200 are patterned to form a contact opening (not shown), and the contact opening is then filled with a first metal layer 204 to form a metal plug 204a. The metal plug 204a may include any conductive material, but it preferably includes a tungsten plug.

Figure 2B:
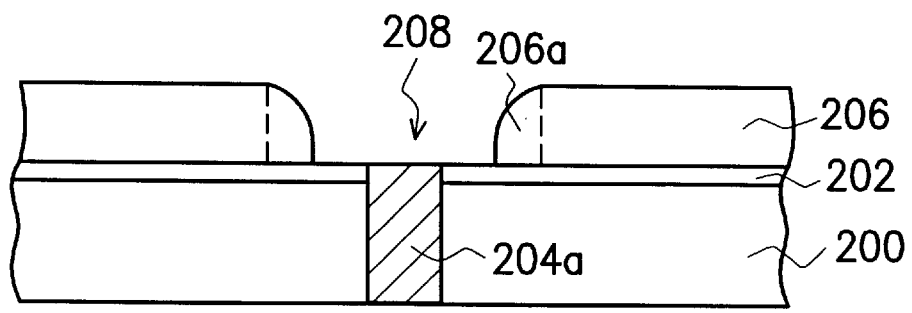

Referring to FIG. 2B, a second dielectric layer 206 is formed on the metal plug 204a and the ARC layer 202. By performing a photolithographic and etching process, a part of the second dielectric layer 206 is removed to form a trench opening 208, wherein the trench opening 208 exposes the metal plug 204a and a part of the ARC layer 202. A dielectric spacer 206a is formed on a sidewall of the trench opening 208. The method for forming the dielectric spacer 206a includes forming an insulating layer in the trench opening 208, followed by performing an etching back process, so that a part of the insulating layer remains to form the dielectric spacer 206a. Although the dielectric spacer 206a can be made of materials different from the material for making the second dielectric layer 206, same material has been used for making both the dielectric spacer 206a and the second dielectric layer 206 in this embodiment.

Figure 2C:
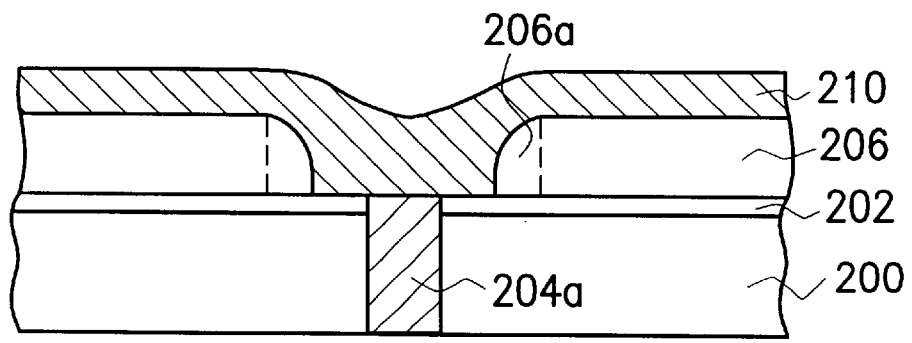

Referring to FIG. 2C, the trench opening 208 is filled with a second metal layer 210. The second metal layer 210 is formed on the second dielectric layer 206 to fill the trench opening 208. The second metal layer 210 outside the trench opening 208 is removed until the second dielectric layer 210 is exposed. The method for removing the second metal layer 210 includes an etching back process, such as chemical mechanical polishing (CMP). The second metal layer 210 and the metal plug 204a together form a dual damascene structure having a T-shape cross-section. Since the dielectric spacer 206a is formed on the sidewall of the trench opening 208, the second metal layer 210 has curve-in sidewalls at both ends, as shown in FIG. 2C.

Figure 2D:
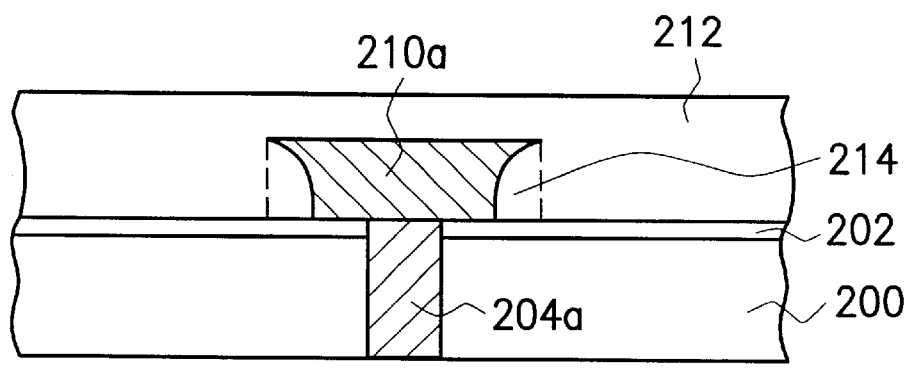

Referring to FIG. 2D, the second dielectric layer 206 and the dielectric spacer 206a are removed to expose the second metal layer 210 and the ARC layer 202. The method for removing the second dielectric layer 206 and the dielectric spacer 206a preferably includes dry etching using a plasma. A third dielectric layer 212 is then formed on the second metal layer 210. It is emphasized in this embodiment that, the space occupied previously by the dielectric spacer 206a is not filled with the third dielectric layer 212 due to the curve-in sidewall profile of the second metal layer 210. As a result, the space, which is delineated by the second metal layer 210 and the third dielectric layer 212, forms the inner air spacer 214 on the ARC layer, as shown in FIG. 2D.

Second Embodiment

Figure 3A:
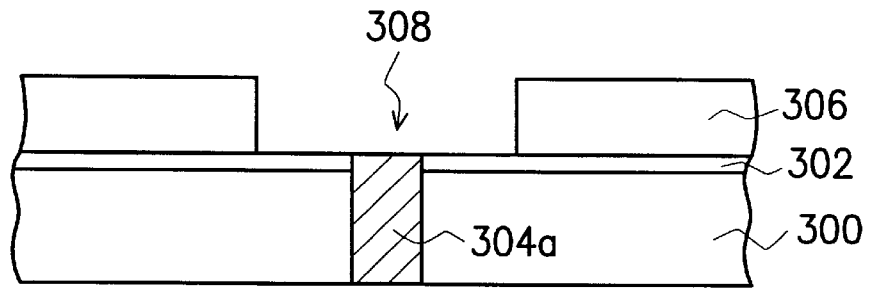
FIGS. 3A through 3D are schematic, cross-sectional diagrams illustrating a method of fabricating a metal interconnect having an inner air spacer according to the second embodiment of this invention.

Referring to FIG. 3A, a first dielectric layer 300 is formed on a MOS device layer (not shown). An ARC layer 302 is then formed on the first dielectric layer 300. The first dielectric layer 300 is made of material, such as silicon dioxide, while the ARC layer 302 may be made of any anti-reflective materials, but is preferably made of silicon oxy-nitride. The ARC layer 302 in this case prevents etching damage done to the first dielectric layer 300 and improves the photolithographic ability in the photolithographic process. The ARC layer 302 and the first dielectric layer 300 are patterned during the photolithographic and etching process to form a contact opening (not shown), and the contact opening is then filled with a first metal layer 304 to form a metal plug 304a. The metal plug 304a may include any conductive material, but is preferably made of tungsten. A second dielectric layer 306 is formed on the metal plug 304a and the ARC layer 302. A part of the second dielectric layer 306 is removed to form a trench opening 308, wherein the trench opening 308 exposes the metal plug 304a and a part of the ARC layer 302.

Figure 3B:
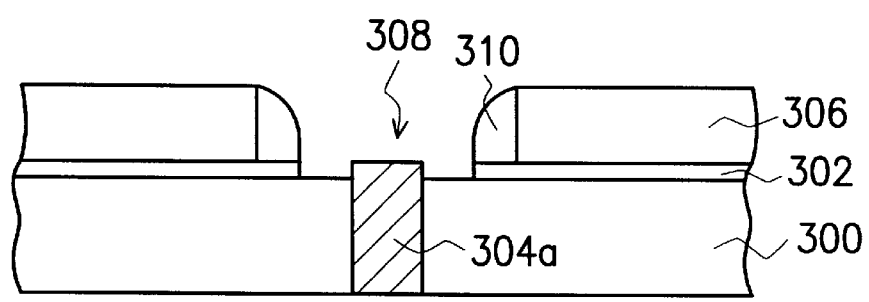

Referring to FIG. 3B, a dielectric spacer 310 is formed on a sidewall of the trench opening 308. The method for forming the dielectric spacer 310 includes forming an insulating layer in the trench opening 308, followed by performing an etching back process, so that a part of the insulating layer remains on the sidewall of the second dielectric layer 306 to form the dielectric spacer 310. Although the dielectric spacer 310 can be made of the same material for making the second dielectric layer 306, the dielectric spacer 310 is made of the material different from the material for making the second dielectric layer 306 in this embodiment. For example, the dielectric spacer 310 is preferably made of silicon nitride. However, the material for making the dielectric spacer 310 is not limited to silicon nitride, any insulating materials can be used to achieve the same result of the present invention. With the dielectric spacer 310 serving as a mask, the exposed part of the ARC layer is removed simultaneously during the formation of the dielectric spacer 310. Therefore, a part of the first dielectric layer 300 is exposed in the trench opening 308.

Figure 3C:
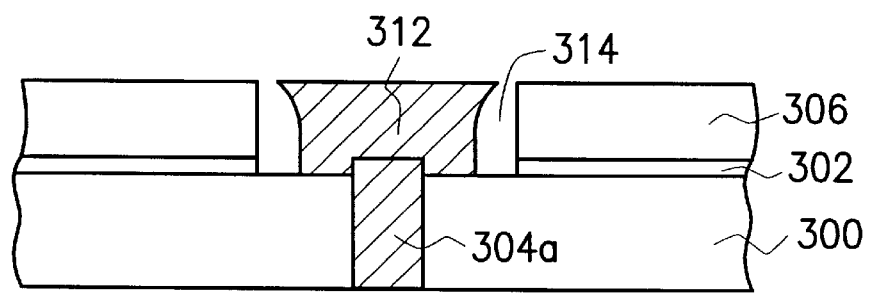

Referring to FIG. 3C, the trench opening 308 is filled with a second metal layer 312. The second metal layer 312 is formed on the second dielectric layer 306 to cover the metal plug 304a and the first dielectric layer 300. The second metal layer 312 outside the trench opening 308 is removed until the second dielectric layer 306 is exposed. The method for removing the second metal layer 312 includes an etching back process, such as CMP. The second metal layer 312 and the metal plug 304a together form a dual damascene structure having a T-shape cross-section. Since the dielectric spacer 306a is formed on the sidewall of the trench opening 308, the second metal layer 312 has curve-in sidewalls at both ends, as shown in FIG. 3C. The dielectric spacer 310 and a part of the ARC layer 302 underneath the dielectric spacer 310 are removed until the first dielectric layer 300 is exposed. This forms an air gap 314 between the second metal layer 312 and the second dielectric layer 306. Although the method for removing the dielectric spacer 310 and the ARC layer 302 preferably includes dry etching by a plasma, one skilled in the art should be able to expect other etching processes to remove the dielectric spacer 310 according to the present invention.

Figure 3D:
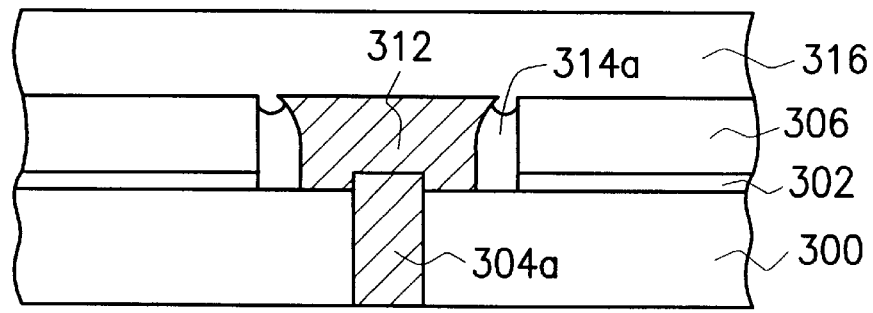

Referring to FIG. 3D, the air gap 314 is sealed off by forming a third dielectric layer 316 on the second metal layer 310 and the second dielectric layer 306. The air gap 314, after being sealed off, forms an inner air spacer 314a on the first dielectric layer 300, wherein the inner air spacer 314a is delineated by the second metal layer 310, the second dielectric layer 306, and the third dielectric layer 316. As shown in FIG. 3D, the inner air spacer 314a is formed adjacent to a curved sidewall of the second metal layer 310.

Summarizing from the two embodiments above, it is understood that the inner air spacer is formed closely adjacent to the metal layer, so that the dielectric constant between the metal interconnects is significantly reduced. The inner air spacer formed as above is also compatible with other dielectric materials in order to reduce the dielectric constant, while such fabrication method does not create too much complexity to the current process. Furthermore, the inner air spacers can be formed on the sidewalls of the metal interconnects that are located wider apart. Thus, this ensures a uniform reduction of the dielectric constant between the metal interconnects and improves the circuit speed as a consequence.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a semiconductor device having air spacers, comprising steps of:
    forming a patterned dielectric layer on a MOS device layer, wherein sidewalls of the patterned dielectric layer delineates an opening;
    forming dielectric spacers on sidewalls of the opening;
    filling the opening with a metal layer, so that sidewalls of the metal layer are adjacent to the dielectric spacers;
    removing the dielectric spacers, so that air gaps are formed adjacent to the sidewalls of the metal layer;
    forming a dielectric capping layer over the metal layer and the patterned dielectric layer, so that the air gaps are sealed off to form inner air spacers.

2. The fabrication method of claim 1, wherein the sidewalls of the metal layer have a curved-in configuration.

3. The fabrication method of claim 1, wherein the patterned dielectric layer includes silicon oxide.

4. The fabrication method of claim 1, wherein the dielectric spacers and the patterned dielectric layer have a same etching rate.

5. The fabrication method of claim 4, wherein the dielectric spacers include silicon oxide.

6. The fabrication method of claim 1, wherein the dielectric spacers and the patterned dielectric layer have a different etching rate.

7. The fabrication method of claim 6, wherein the dielectric spacers include silicon nitride.

8. A fabrication method for a metal interconnect structure having an inner air spacer, comprising steps of:
    forming a first dielectric layer and an anti-reflection coating (ARC) layer in sequence on a MOS device layer;
    patterning the first dielectric layer and the ARC layer for forming a contact opening;
    filling the contact opening with a metal plug;
    forming a second dielectric layer on the metal plug and the patterned ARC layer;
    patterning the second dielectric layer, so that sidewalls of the patterned second dielectric layer delineate a trench opening;
    forming a dielectric spacer on the sidewall of the patterned second dielectric layer;
    filling the trench opening with a metal layer, so that a sidewall of the metal layer is adjacent to the dielectric spacer;
    forming an inner air spacer adjacent to the sidewall of the metal layer; and
    forming a third dielectric layer over the metal layer and the patterned second dielectric layer.

9. The fabrication method of claim 8, wherein the metal plug includes a tungsten plug.

10. The fabrication method of claim 8, wherein the step of forming the inner air spacer further comprising:
    removing the dielectric spacer and the patterned second dielectric layer until the sidewall of the metal layer is exposed; and
    forming a third dielectric layer over the metal layer and the ARC layer, so that the inner air spacer is formed adjacent to the sidewall of the metal layer, and the inner air spacer is delineated by the metal layer, the third dielectric layer, and the ARC layer.

11. The fabrication method of claim 10, wherein the dielectric spacer and the patterned second dielectric layer have a same etching rate.

12. The fabrication method of claim 10, wherein the dielectric spacer has a higher etching rate than the ARC layer.

13. The fabrication method of claim 8, wherein the step of forming the inner air spacer further comprising:
    removing the dielectric spacer and a part of the ARC layer below the dielectric spacer until the first dielectric layer is exposed; and
    forming a third dielectric layer over the metal layer and the patterned second dielectric layer, so that the inner air spacer is formed adjacent to the sidewall of the metal layer, and the inner air spacer is delineated by the metal layer, the third dielectric layer, and the first dielectric layer.

14. The fabrication method of claim 13, wherein the dielectric spacer has a higher etching rate than the patterned second dielectric layer.

15. The fabrication method of claim 13, wherein the dielectric spacer and the ARC layer have a same etching rate.

16. A fabrication method for an interconnect structure having air spacers, comprising steps of:

forming a metal plug in a first dielectric layer and a ARC layer;

forming a patterned second dielectric layer on a part of the ARC layer;

forming a metal layer on the metal plug, wherein the metal layer has curve-in sidewalls;

forming inner air spacers adjacent to the sidewalls of the metal layer; and forming a third dielectric layer over the metal layer.

17. The fabrication method of claim 16, further includes forming dielectric spacers on the sidewalls of the patterned second dielectric layer.

18. The fabrication method of claim 16, wherein the step of forming the inner air spacer further comprising:

removing dielectric spacers and the patterned second dielectric layer; and forming the third dielectric layer over the metal layer, so that the inner air spacers are formed adjacent to the curve-in sidewalls of the metal layer.

19. The fabrication method of claim 18, wherein the dielectric spacers and the patterned second dielectric layer have a same etching rate.

20. The fabrication method of claim 18, wherein the dielectric spacers and the patterned second dielectric layer are removed by a dry etching process using a plasma.

21. The fabrication method of claim 16, wherein the step of forming the inner air spacer further comprising:

removing dielectric spacers formed adjacent to the sidewalls of the patterned second dielectric layer and a part of the ARC layer below the dielectric spacer, so that air gaps are formed between the metal layer and the patterned second dielectric layer; and forming the third dielectric layer over the metal layer, so that the air gaps are sealed off to form the inner air spacers adjacent to the curve-in sidewalls of the metal layer.

22. The fabrication method of claim 21, wherein the dielectric spacers have a higher etching rate than the patterned second dielectric layer.

23. The fabrication method of claim 21, wherein the dielectric spacers and the ARC layer have a same etching rate.

24. The fabrication method of claim 21, wherein the dielectric spacers are removed by a dry etching process using a plasma.

* * * * *